(12) United States Patent
Mori et al.

(10) Patent No.: US 10,714,270 B2
(45) Date of Patent: Jul. 14, 2020

(54) PHOTOELECTRIC CONVERSION DEVICE AND METHOD FOR MANUFACTURING THE SAME

(71) Applicant: KABUSHIKI KAISHA TOSHIBA, Minato-ku (JP)

(72) Inventors: Shigehiko Mori, Kawasaki (JP); Takeshi Gotanda, Yokohama (JP); Haruhi Oooka, Kawasaki (JP); Kenji Todori, Yokohama (JP)

(73) Assignee: KABUSHIKI KAISHA TOSHIBA, Minato-ku (JP)

( * ) Notice: Subject to any disclaimer, the term of this patent is extended or adjusted under 35 U.S.C. 154(b) by 97 days.

(21) Appl. No.: 15/690,518

(22) Filed: Aug. 30, 2017

(65) Prior Publication Data

US 2018/0211792 A1   Jul. 26, 2018

(30) Foreign Application Priority Data

Jan. 24, 2017 (JP) ................. 2017-010525

(51) Int. Cl.
*H01G 9/20* (2006.01)
*H01L 51/00* (2006.01)
(Continued)

(52) U.S. Cl.
CPC ......... *H01G 9/2031* (2013.01); *H01G 9/0029* (2013.01); *H01L 51/004* (2013.01);
(Continued)

(58) Field of Classification Search
CPC ............. H01L 51/0076; H01L 51/0034; H01L 51/4253; H01L 51/442
See application file for complete search history.

(56) References Cited

U.S. PATENT DOCUMENTS 6,310,674 B1 * 10/2001 Suzuki ............... G02F 1/13439
                                                      349/106
6,617,056 B1    9/2003 Harra et al.
(Continued)

FOREIGN PATENT DOCUMENTS

JP    2011-181904    9/2011
JP       5206983     6/2013
(Continued)

OTHER PUBLICATIONS

M. Dianetti, et al., "TCO-free flexible organo metal trihalide perovskite planar-heterojunction solar cells," 2015, Solar Energy Materials & Solar Cells 140, pp. 150-157.

*Primary Examiner* — Ermias T Woldegeorgis
(74) *Attorney, Agent, or Firm* — Oblon, McClelland, Maier & Neustadt, L.L.P.

(57) ABSTRACT

The present embodiments provide a flexible, lightweight and highly efficient photoelectric conversion device and further provide a manufacturing method thereof. The photoelectric conversion device according to the embodiment comprises a laminate structure of a substrate, an ITO electrode, a photoelectric conversion layer and a counter electrode. When subjected to surface X-ray diffraction analysis, the ITO electrode shows an X-ray diffraction profile characterized in that the peak at a diffraction peak position in the range of 2θ=30.6±0.5° has a half-width of 1.0° or less. The ITO electrode in the device can be formed by forming an amorphous-phase ITO film on the substrate and then by subjecting the film to annealing treatment at a temperature of 200° or less.

20 Claims, 3 Drawing Sheets

(51) Int. Cl.
    *H01G 9/00*     (2006.01)
    *H01L 51/44*     (2006.01)
    *H01L 51/42*     (2006.01)
    *H01L 51/52*     (2006.01)

(52) U.S. Cl.
    CPC ...... *H01L 51/0034* (2013.01); *H01L 51/0035* (2013.01); *H01L 51/0037* (2013.01); *H01L 51/0076* (2013.01); *H01L 51/0096* (2013.01); *H01L 51/442* (2013.01); *H01L 51/0047* (2013.01); *H01L 51/4226* (2013.01); *H01L 51/4246* (2013.01); *H01L 51/4253* (2013.01); *H01L 51/5206* (2013.01); *H01L 2251/308* (2013.01); *Y02E 10/549* (2013.01)

(56) References Cited

U.S. PATENT DOCUMENTS

| | | | | |
|---|---|---|---|---|
| 2007/0154629 | A1* | 7/2007 | Fujita | C01G 19/00 427/126.3 |
| 2013/0122305 | A1* | 5/2013 | Shiraishi | C01G 19/02 428/402 |
| 2016/0104843 | A1 | 4/2016 | Kobayashi et al. | |
| 2016/0285022 | A1 | 9/2016 | Gotanda et al. | |
| 2016/0372674 | A1* | 12/2016 | Nakano | C08K 3/04 |

FOREIGN PATENT DOCUMENTS

| | | |
|---|---|---|
| JP | 2016-027587 | 2/2016 |
| JP | 2016-051693 | 4/2016 |
| JP | 2016-181634 | 10/2016 |
| WO | WO 00/51139 A1 | 8/2000 |
| WO | WO 2014/054759 A1 | 4/2014 |

* cited by examiner

PHOTOELECTRIC CONVERSION DEVICE AND METHOD FOR MANUFACTURING THE SAME

CROSS-REFERENCE TO RELATED APPLICATIONS

This application is based upon and claims the benefit of priority from the prior Japanese Patent Application No. 2017-010525, filed on Jan. 24, 2017, the entire contents of which are incorporated herein by reference.

FIELD

Embodiments of the present disclosure relate to a photoelectric conversion device and a manufacturing method thereof.

BACKGROUND

Photoelectric conversion devices, such as, solar cells, photosensors, light-emitting devices, photodiodes and optical memories, can comprise perovskite or organic materials serving as the photoelectric conversion components. Those are expected as low-cost photoelectric conversion devices because their layers can be formed by inexpensive coating processes.

Perovskite solar cells, which comprise perovskite materials serving as the photoelectric conversion components, have been recently hoped to be low-cost and highly efficient solar cells. When perovskite solar cells are manufactured by a wet-coating process, a roll-to-roll method can be adopted. In the roll-to-roll method, a substrate loaded with layers of the solar cell is transferred around each roll and hence needs to be flexible.

For the flexible substrate, a polymer film is suitably employed. In addition, because a polymer film is generally lighter in weight than a common glass substrate, the resultant solar cell can be potentially installed on curved or poor load-bearing roofs of factories and the like, on which it has been difficult to install conventional solar cells. Thus, there is possibility that perovskite solar cells comprising polymer film substrates may extend the market of solar cells.

A perovskite solar cell generally comprises such components as a substrate/a transparent electrode/a first intermediate layer/a perovskite layer (photoelectric conversion layer)/a second intermediate layer/and a counter electrode. Examples of materials for the transparent electrode include indium-tin oxide (ITO) and fluorine-doped tin oxide (FTO). The electrode of ITO has lower sheet resistance and smaller surface roughness than that of FTO, and hence is advantageous to enhance the efficiency.

The first intermediate layer is made of organic materials, inorganic materials or composite materials of both. For example, it is known that high efficiency is realized by adoption of a perovskite solar cell comprising a ITO transparent electrode and a first intermediate layer made of polyethylenedioxythiophene:polystyrenesulfonic acid (PEDOT:PSS). This can be explained by the following three reasons.

First, that is because the ITO film electrode has high light transmittance, low sheet resistance and small surface roughness.

Second, that is because PEDOT:PSS has excellent electroconductivity and high light transmittance; and thirdly, that is because the work functions of ITO and PEDOT:PSS are positioned at such near energy levels to the valence band of the perovskite material that carriers can migrate efficiently.

The ITO film can be formed on a glass substrate at a high temperature because glass generally has high heat-resistance. Because of the film-formation at a high temperature, the ITO film thus formed is crystalized. On the other hand, however, if a polymer film is adopted as the substrate, the ITO film must be formed at a low temperature because the polymer film substrate may be damaged at a high temperature. In this case, since formed at a low temperature, the ITO film is in an amorphous phase.

The ITO film is then coated with PEDOT:PSS, which is PEDOT doped with acidic PSS and hence has strong acidity (a low pH value). However, it is known that, although having acid resistance in a crystal phase, ITO did not have chemical resistance and hence is vulnerable to acid in an amorphous phase. Accordingly, if acid resistance is regarded as important, the ITO film needs to be formed at such a high temperature as to be crystalized and therefore the substrate cannot be a polymer film. Further, the crystalized ITO film is also unfavorable in view of flexibility. On the other hand, when the first intermediate layer is formed on the amorphous ITO film by a wet-coating process, the solvent of the coating solution must be selected in consideration of poor chemical resistance of the amorphous ITO film so that the solvent may not damage the ITO film. This requirement narrows down selection of formable first intermediate layers, and hence seriously limits development of perovskite solar cells.

In order to reduce the damage of ITO in the structure of a polymer substrate/an amorphous-phase ITO film/a PEDOT:PSS layer of low pH value, it is proposed to crystalize the surface of the amorphous-phase ITO film by laser annealing. The crystalized surface functions as a protective layer, and hence can reduce possibility that the amorphous-phase ITO film may be damaged by the PEDOT:PSS layer of low pH value. However, the crystalized surface must be thickened enough to serve as a protective layer, and accordingly it is necessary to increase the laser power and the exposure time thereof. Consequently, the production cost increases. In addition, if comprising a thick crystalized surface, the ITO film may lose flexibility. Further, if large-area ITO films are intended to be annealed, laser instruments for the annealing treatment needs to be enlarged and the number thereof needs to be increased although they are expensive. Accordingly, the production cost further goes up.

DETAILED DESCRIPTION

The photoelectric conversion device according to an embodiment comprises a laminate structure of
  a substrate,
  an indium-tin oxide electrode,
  a photoelectric conversion layer, and
  a counter electrode, stacked in this order;
wherein
  said indium-tin oxide electrode shows an X-ray diffraction profile in which the peak at a diffraction peak position in the range of 2θ=30.6±0.5° has a half-width of 1.0° or less when subjected to surface X-ray diffraction analysis according to Bragg-Brebdano method using CuKα line.

Further, the method according to another embodiment for manufacturing a photoelectric conversion device comprising a laminate structure of a substrate, an indium-tin oxide electrode, a photoelectric conversion layer, and a counter electrode, stacked in this order;

wherein said indium-tin oxide electrode is formed by the steps of: forming an amorphous-phase indium-tin oxide film on said substrate, and then subjecting the film to annealing treatment at a temperature of 200° C. or less.

Embodiments will now be explained with reference to the accompanying drawings.

First Embodiment

Figure 1:
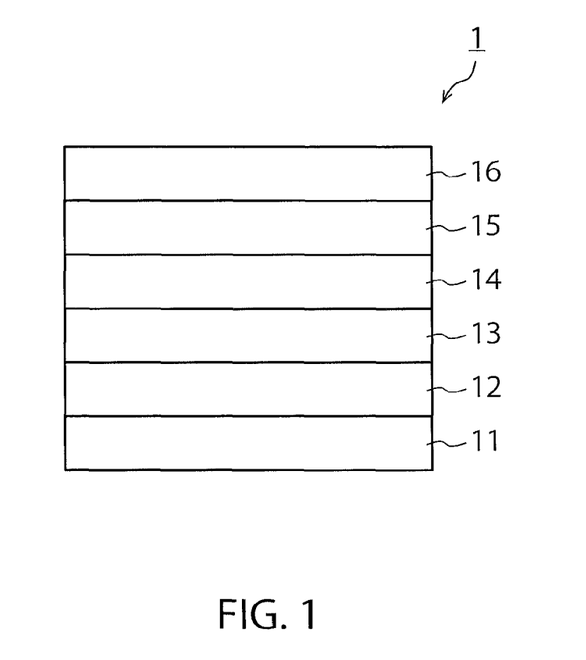
FIG. 1 is a schematic sectional view of a photoelectric conversion device according to the embodiment.

FIG. 1 is a schematic sectional view of a photoelectric conversion device 1 according to the embodiment. Hereinafter, photoelectric conversion devices are often referred to simply as "devices" for the purpose of simplification. The device of the present embodiment comprises a substrate 11, a transparent electrode 12, a first intermediate layer 13, a photoelectric conversion layer 14, a second intermediate layer 15, and a counter electrode 16. The first intermediate layer 13 and/or the second intermediate layer 15 can be omitted. The transparent electrode is provided on the substrate, and the first intermediate layer is provided on the transparent electrode. The photoelectric conversion layer is provided on the first intermediate layer, and comprises, for example, a perovskite material. The second intermediate layer is provided on the photoelectric conversion layer, and the counter electrode is provided on the second intermediate layer.

The component members constituting the device according to the present embodiment are individually described below in detail.

(Substrate)

The substrate 11 supports other component members. The substrate can be made of any materials selected from known ones used for conventional photoelectric conversion devices. However, incident light needs to pass through the substrate and to reach the photoelectric conversion layer so that the device of the embodiment can work effectively. In view of that, the substrate is preferably made of a highly transparent material.

Further, the substrate has a surface on which the electrode can be formed, and accordingly is preferably not impaired by heat and organic solvents. The substrate material may be either inorganic or organic one. Examples of inorganic materials include: non-alkali glass and quartz glass; and examples of organic materials include: plastics, such as, polyethylene, polyethylene terephthalate (PET), polyethylene naphthalate (PEN), polyimide (PI), polyamide, polyamide-imide, and polycycloolefin. Those organic materials may be in the form of liquid crystal polymers or polymer films.

There are no particular restrictions on the thickness of the substrate as long as it has enough strength to support other component members. For example, the substrate material may have flexibility. Particularly when the device is manufactured according to the roll-to-roll method or is required to be flexible in itself, the substrate is preferably made of a flexible material.

Preferred examples of materials having both transparency and flexibility include: organic substances, such as, polyethylene naphthalate (heat-resistant temperature: about 160° C.), polyethylene terephthalate (heat-resistant temperature: about 105° C.), polyethylene (heat-resistant temperature: about 60 to 100° C.), polyimide (heat-resistant temperature: about 240° C.), polyamide (heat-resistant temperature: about 100 to 150° C.), polyamide-imide (heat-resistant temperature: about 240° C. or below), and liquid crystal polymers. When the substrate is made of an organic material, the material preferably has a heat-resistant temperature of 240° C. or below although the heat-resistant temperature depends on the blending ratio of polymers or on the polymerization ratio of copolymer. The substrate may be a very thin or void-containing flexible and semi-transparent inorganic sheet.

If made of a flexible material, the substrate 11 may be placed on another highly rigid support, such as a glass plate, so as to stably carry out film-forming steps in the production process of the device. After the device is produced, the support can be separated from the substrate.

The substrate is positioned on the light-incident side of the device, and hence it is possible to provide an antireflection film of, for example, moth-eye structure on the light-incident surface. The antireflection film enables incident light to enter the device efficiently and thereby can improve the energy conversion efficiency of the device. The moth-eye structure has a surface on which convexes of about 100 nm height are regularly arranged. Because of this convex structure, the refractive index continuously changes along the thickness direction. Accordingly, if the substrate is coated with that antireflective film, the film prevents the refractive index from discontinuous changing. As a result, the film reduces reflection of the incident light and thereby improves the conversion efficiency of the device.

(Indium-Tin Oxide Electrode)

The device according to the present embodiment comprises an indium-tin oxide (hereinafter, often referred to simply as "ITO") electrode. As a material for electrodes, ITO is known to have high light-transparency, low sheet resistance and small surface roughness.

The ITO electrode in the device according to the embodiment shows such a characteristic X-ray diffraction profile as has peaks at the positions where there are no peaks in the profile of an amorphous-phase ITO layer. Specifically, when subjected to surface X-ray diffraction analysis according to Bragg-Brebdano method using CuKα line, the ITO electrode layer shows an X-ray diffraction profile having peaks at the positions of 21.5±0.5°, 30.6±0.5°, 45.7±0.5° and 51.0±0.5°. Those peaks are assigned to a crystal-phase ITO layer. The device of the embodiment is characterized in that the ITO layer shows an X-ray diffraction profile in which the peak at a diffraction peak position in the range of 2θ=30.6±0.5° has a half-width of 1.0° or less. Further, the peak at a diffraction peak position in the range of 2θ=51.0±0.5° preferably also has a half-width of 1.0° or less.

If having the above characteristics, the ITO layer has sufficient acid-resistance and hence can be thinned enough to realize a flexible photoelectric conversion device. Thus, it is preferred that the ITO electrode layer is presumed to show the above X-ray diffraction profile. (Details will be described later.)

The ITO layer showing the above X-ray diffraction profile can be produced in a manner in which an ITO-containing amorphous phase is formed by sputtering or the like and then is subjected to annealing treatment at an appropriate temperature. When a heat-resistant substrate is intended to be coated with an ITO layer having sufficient acid-resistance, it has been general to carry out sputtering at a temperature of 300° C. or above and thereby to form a polycrystalline ITO layer. In contrast, the annealing treatment is carried out at a low temperature in the embodiment, so as to realize sufficient acid-resistance.

Specifically, according to the embodiment, the ITO layer is formed in the following manner. First, ITO is accumulated on the substrate by sputtering or vacuum deposition at a temperature of, for example, 100° C. or below, to form a ITO film. Since formed at a low temperature, the formed ITO film is not in a crystal phase but in an amorphous phase. Also, since not exposed to a high temperature, the substrate serving as an under layer is hardly damaged even if made of an organic material. However, in the step of forming a first intermediate layer on the amorphous-phase ITO film, the ITO film may be damaged if strongly acidic PEDOT:PSS is adopted as the material of the first intermediate layer.

In view of that, the ITO film is then subjected to annealing treatment so as to convert the amorphous phase into the crystal phase. As a result, this treatment enables the ITO film to have chemical resistance, namely, acid resistance. The annealing treatment is carried out preferably at a low temperature. Specifically, the annealing temperature is preferably 200° C. or below, more preferably 150° C. or below. The annealing time is preferably 0.5 to 6 hours, more preferably 1 to 3 hours, so as to grow the crystal phase sufficiently. Because of the annealing treatment at a low temperature, the processing cost can be reduced in the embodiment. In addition, since the annealing treatment is carried out at a low temperature, the substrate is hardly damaged even if made of an organic material.

The annealing treatment thus converts the amorphous phase into the crystal phase. In order that the conversion can proceed advantageously, it is preferred to control the composition of ITO. Specifically, ITO is a complex oxide of indium oxide ($In_2O_3$) and tin oxide ($SnO_2$), and the doping ratio of Sn into $In_2O_3$ can be controlled to manage the temperature at which ITO begins to crystallize. If doped with Sn in a high ratio, $In_2O_3$ contains the impurity in a large amount and consequently the resultant ITO begins to crystallize at a high temperature. The applicant's research has revealed that, if the weight ratio of In to Sn, namely, In/Sn is 24 (In:Sn=96 mass %:4 mass %) or more, the ITO begins to crystallize at a temperature of 140 to 150° C. It was also found that, if the ratio In/Sn is 13 (In:Sn=93 mass %:7 mass %), the ITO begins to crystallize at about 180° C.

The ITO layer normally does not contain metals other than In or Sn. However, unless the effect of the embodiment is impaired, the ITO layer may contain metals other than In or Sn. For example, it may contain Ce, Ti, Ga, Zn or W (hereinafter, they are often collectively referred to as "metal atom x"). The metal atom x is contained in an amount satisfying the condition that the atomic ratio of metal atom x/(In and metal atom x) is preferably 5.0 atom % or less, further preferably 0.5 atom % or less.

In the manner described above, even if the substrate is made of organic materials and the like, it is possible to easily form a highly acid-resistant ITO layer at low cost without damaging the substrate. The ITO layer thus formed has sufficient acid-resistance even if having a thin thickness. Accordingly, if a flexible material is adopted as the substrate, the resultant device can have satisfying flexibility. When the device is requited to be flexible, the ITO layer has an average thickness of preferably 300 nm or less, further preferably 150 nm or less. In the embodiment, the ITO layer can achieve a sufficient conversion efficiency even if having a thickness of 150 nm.

(First and Second Intermediate Layers)

The device according to the present embodiment optionally comprises the first intermediate layer and/or the second intermediate layer. If exist, each of the first and second intermediate layers 13 and 15 serves as a hole transport layer or an electron transport layer. According to the structure of the photoelectric conversion layer or the like, they are individually installed appropriately. For example, if the first intermediate layer 13 serves as a hole transport layer, it has functions of blocking electrons generated in the photoelectric conversion layer 14 and of transferring positive holes also generated there selectively and efficiently to the ITO electrode 12. On the other hand, in that case, the second intermediate layer 15 works as an electron transport layer, which has functions of blocking holes generated in the conversion layer 14 and of transferring electrons also generated there selectively and efficiently to the counter electrode 16.

The first and second intermediate layers 13 and 15 are made of materials according to the aimed functions. They are selected from organic materials, inorganic materials or composite materials of both.

Examples of the organic materials usable in the embodiment include: electroconductive polymers, such as, polyaniline and derivatives thereof, polythiophene and derivatives thereof, polyethylenedioxythiophene:polystyrenesulfonic acid (PEDOT:PSS), and fullerenes. Examples of the fullerenes include: hydrogenated fullerenes, such as $C_{60}H_{36}$ and $C_{70}H_{36}$; oxide fullerenes of $C_{60}$ and $C_{70}$; fullerene metal complexes; and other fullerene derivatives, such as, [6,6]-phenyl$C_{61}$butyric methyl ester (60PCBM), [6,6]-phenyl$C_{71}$butyric methyl ester (70PCBM), and bisindene C60 (60ICBA).

Examples of the inorganic materials usable in the embodiment include: oxides, such as, tungsten oxide, molybdenum oxide, vanadium oxide, titanium oxide, zinc oxide, nickel oxide, lithium oxide, calcium oxide, cesium oxide, aluminum oxide and copper oxide.

The first and second intermediate layers in the embodiment can be formed by a process selected according to the materials thereof. Examples of the forming process include: vacuum film-formation, such as, vacuum deposition or sputtering; sol-gel process; and wet-coating.

The following particularly explains the first intermediate layer adjacent to the ITO layer in the case where a strongly acidic material is adopted.

If PEDOT:PSS is used as a material for the first intermediate layer, the layer serves as a hole transport layer.

The hole transport layer is formed by, for example, coating the ITO layer with a PEDOT:PSS solution. PEDOT:PSS, which is PEDOT doped with PSS, can realize high electroconductivity. The dopant PSS contains sulfone groups, and hence has acidity. Accordingly, the PEDOT:PSS solution shows a low pH value. For example, a commercially available PEDOT:PSS solution AI4083 ([trademark], manufactured by Heraeus GmbH) shows a pH value of 1.2 to 2.2. The work function of PEDOT:PSS is about 5.0 eV, which corresponds to that of ITO, and therefore it can be expected to realize efficient carrier migration between the ITO layer and PEDOT:PSS.

Since highly electroconductive PEDOT:PSS is generally strongly acidic, the ITO layer adjacent to the PEDOT:PSS is required to have acid-resistance. However, amorphous-phase ITO is easily damaged by strongly acidic PEDOT:PSS and hence is not suitable for the ITO layer. In contrast, crystal-phase ITO can be kept sufficiently from damage from strongly acidic PEDOT:PSS. For that reason, the crystal-phase ITO is converted from the amorphous-phase ITO in the manner described above, so as to gain acid-resistance against PEDOT:PSS.

In the above description, the first intermediate layer is explained in the case where PEDOT:PSS is adopted as a material thereof. However, even in other cases where the material of the first intermediate layer causes damage to amorphous-phase ITO, the ITO layer formed in the aforementioned manner can be also employed to produce the device without impairing the characteristics.

The first and second intermediate layers may individually comprises laminate structures of stacked plural layers, and further another third intermediate layer may be provided according to the purpose.

(Photoelectric Conversion Layer)

There are no particular restrictions on the photoelectric conversion layer 14 in the device according to the embodiment as long as it can generate electricity under excitation by incident light. However, the photoelectric conversion layer preferably contains a perovskite compound and/or an organic substance.

[Photoelectric Conversion Layer Containing a Perovskite Compound]

The following explains a photoelectric conversion layer 14 in which a perovskite compound is employed.

The photoelectric conversion layer 14 can be formed by a wet-coating process from a perovskite-material solution described below. The perovskite-material solution comprises a solvent and perovskite crystallites dissolved or dispersed therein. A typical perovskite crystallite has a composition represented by the following formula (1): $ABX_3$ (1); and has a three-dimensional crystal structure.

In the formula (1), A is a monovalent cation of amine compound, B is a divalent metal cation, and X is a monovalent anion of halogen.

The perovskite crystal structure is categorized into 4 types, namely, 0- to 3-dimensional structures. Among them, preferred are the 2- and 3-dimensional structures comprising compositions represented by $A_2BX_4$ and $ABX_3$, respectively, because they are advantageous in obtaining a highly efficient photoelectric conversion component and a device comprising that.

It is known that the binding energy of excitons is low in the 3-dimensional structure, which is hence favorable for producing a highly efficient photoelectric conversion component or device. The perovskite crystal is known to have a 2- or 3-dimensional structure when the A ion has a large or small ionic radius, respectively.

Specifically, the perovskite crystal in 3-dimensional structure is empirically known to be formed when the A ion has such an ionic radius that the tolerance factor t may be in the range of t=0.75 to 1.1. Here, the tolerance factor t is a value represented by the following formula (2) in which the ionic radii are Shannon's ones although there are some kinds of ionic radii.

$$t=(\text{ionic radius of } A + \text{ionic radius of } B)/\{2^{1/2} \times (\text{ionic radius of } B + \text{ionic radius of } X) \quad (2)$$

In order to satisfy the above condition of the A ion, the A ions in the crystals are monovalent cations of amine compounds, metals or mixture of both. If the A ion is a monovalent cation of amine compound, the compound is preferably at least one selected from the group consisting of methylammonium ($CH_3NH_2$) and formamidinium ($NH_2CHNH$). If the A ion is a monovalent cation of metal, the metal is preferably at least one selected from the group consisting of cesium (Cs) and rubidium (Rb). The B and X ions are a divalent metal cation and a monovalent anion of halogen, respectively. The B ion is preferably at least one selected from the group consisting of ions of lead (Pb), tin (Sn) and magnesium (Mg), and the X ion is preferably at least one selected from the group consisting of ions of iodine (I), bromine (Br) and chlorine (Cl). They realize high photoelectric conversion efficiency.

Examples of the solvent used in the perovskite-material solution include: N,N-dimethylformamide (DMF), N,N-dimethylacetamide (DMA), dimethyl sulfoxide (DMSO), N-methyl-2-pyrrolidone (NMP), acetone, and acetonitrile. Those solvents can be used singly or in mixture. The solvent is not particularly restricted as long as it can dissolve or disperse the perovskite material homogeneously.

[Photoelectric Conversion Layer Containing an Organic Substance]

The following explains a photoelectric conversion layer 14 which has a heterojunction or bulkheterojunction structure comprising an organic substance.

A typical bulkheterojunction-type photoelectric conversion layer 14 usable in the embodiment contains microlayer-separated structures in which a p-type semiconductor (electron donor) and an n-type semiconductor (electron acceptor) are mixed. Among the mixed p-type and n-type semiconductors in the conversion layer 14, pn-junctions of nano-order size are formed. Accordingly, photocharge separation at the junction interfaces can be utilized to extract an electric current. The p-type semiconductor comprises an electron donating material while the n-type one comprises an electron accepting material. In the embodiment, organic semiconductors may be used as both or either of the p-type and/or n-type semiconductors.

Examples of the p-type organic semiconductors include: polythiophene and derivatives thereof, polypyrrole and derivatives thereof, pyrazoline derivatives, arylamine derivatives, stilbene derivatives, triphenyldiamine derivatives, oligothiophene and derivatives thereof, polyvinyl carbazole and derivatives thereof, polysilane and derivatives thereof, polysiloxane derivatives having aromatic amines in their main or side chains, polyaniline and derivatives thereof, phthalocyanine derivatives, porphyrin and derivatives thereof, polyphenylenevinylene and derivatives thereof, polythienylenevinylene and derivatives thereof, benzodithiophene derivatives, and thieno[3,2-b]thiophene derivatives. Those substances may be combined to use as the p-type organic semiconductors. Further, it is also possible to use copolymers composed of the above substances. Examples of the copolymers include thiophene-fluorene copolymer and phenyleneethynylene-phenylenevinylene copolymer.

Preferred p-type organic semiconductors are preferably electroconductive polymers containing π-conjugated systems, such as, polythiophene and derivatives thereof, which ensure relatively excellent steric regularity and have relatively high solubility to solvents. The polythiophene and derivatives thereof are not particularly restricted as long as they have thiophene skeletons. Examples of the polythiophene and derivatives thereof include: polyalkylthiophenes, polyarylthiophenes, polyalkylisothionaphthenes, and polyethylenedioxythiophenes. Examples of the polyalkylthiophenes include: poly3-methylthiophene, poly3-butylthiophene, poly3-hexylthiophene, poly3-octylthiophene, poly3-decylthiophene, and poly3-dodecylthiophene. Those are polyalkylthiophenes ("P3AT") which have substituents at their 3-positions. Examples of the polyarylthiophenes include: poly3-phenylthiophene and poly3-(p-alkylphenyl-thiophene). Examples of the polyalkylisothionaphthenes include: poly3-butylisothionaphthene, poly3-hexylisothionaphthene, poly3-octylisothionaphthene, and poly3-decylisothionaphthene.

Further, recently, other derivatives, such as PCDTBT (poly[N-9"-hepta-decanyl-2,7-carbazole-alt-5,5-(4',7'-di-2-thienyl-2',1',3'-benzothiadiazole)]), which is a copolymer of carbazole, benzothiadiazole and thiophene, have been known as compounds capable of realizing excellent photoelectric conversion efficiency. Furthermore, also preferred are copolymers of benzodithiophene (BDT) derivatives and thieno[3,2-b]thiophene derivatives. Preferred examples thereof include: poly[4,8-bis[(2-ethylhexyl)oxy]benzo-[1,2-b:4-5-b']dithiophene-2,6-dyl][3-fluoro-2-[(2-ethylhexyl)-carbonyl]thieno[3,4-b]thiophenedyl]] (PTB7); and PTB7-Th (often referred to as "PCE10" or "PBDTTT-EFT), which contains thienyl group having weak electron-donating ability in place of the alkoxy group in PTB7.

The n-type semiconductor is preferably fullerene or derivatives thereof but not particularly limited to them. Examples thereof include derivatives comprising basic skeletons of C60, C70, C76, C78 or C84. In those fullerene derivatives, carbon atoms in the fullerene skeletons may be modified with any functional groups, which may connect to each other to form ring structures. The fullerene derivatives include fullerene-containing polymers. The fullerene derivatives preferably contain functional groups having enough high compatibility with solvents to be very soluble therein.

Examples of the functional groups in the fullerene derivatives include: hydrogen atom; hydroxyl group; halogen atoms, such as, fluorine and chlorine; alkyl groups, such as, methyl and ethyl; alkenyl groups, such as, vinyl; cyano group; alkoxy groups, such as, methoxy and ethoxy; aromatic hydrocarbon groups, such as, phenyl and naphthyl; and aromatic heterocyclic groups, such as, thienyl and naphthyl. Concrete examples of the fullerene derivatives include: hydrogenated fullerenes, such as, C60H36 and C70H36; oxide fullerenes comprising basic skeletons of C60, C70 and the like; and fullerene metal complexes.

Among the above, it is particularly preferred to use [60]PCBM ([6,6]-phenylC61butyric methyl ester) or [70] PCBM ([6,6]-phenylC71butyric methyl ester) as the fullerene derivative.

Further, an unsubstituted fullerene C70 is also preferably employed because it efficiently generates photocarriers and hence is suitably adopted in an organic thin-film solar cell.

The photoelectric conversion layer 14 contains the n- and p-type organic semiconductors preferably in such a mixing ratio that the relative weight of the n-type one may be 0.5 to 4.0 provided that the relative weight of the p-type one is assumed to be 1. If the p-type semiconductor is P3AT or the like, the ratio of n:p is preferably about 1:1. If PCDTBT or the like is adopted as the p-type semiconductor, the ratio of n:p is preferably about 4:1. If the p-type semiconductor is PCE-10 or the like, the n:p is preferably about 1 to 3:1, more preferably 1.5:1.

Examples of the solvents used in the organic material solution include: unsaturated hydrocarbons, halogenated aromatic hydrocarbons, halogenated saturated hydrocarbons, and ethers. Examples of the unsaturated hydrocarbons include: toluene, xylene, tetracene, decalin, mesitylene, n-butylbenzene, sec-butylbenzene, and tert-butylbenzene. Examples of the halogenated aromatic hydrocarbons include: chlorobenzene, dichlorobenzene, and trichlorobenzene. Examples of the halogenated saturated hydrocarbons include: tetrachlorocarbon, chloroform, dichloromethane, dichloroethane, chlorobutane, bromobutane, chloropentane, chloromelanite, bromohexane, and chlorocyclohexane. Examples of the ethers include: tetrahydrofuran and tetrahydropyran. Particularly preferred are halogenated aromatic hydrocarbons. Those solvents can be use singly or in combination. There are no particular restrictions on the solvent as long as it can dissolve or disperse the organic substances homogeneously.

The coating solution can be applied to form the layer by, for example, spin coating, dip coating, casting, bar coating, roll coating, wire-bar coating, spraying, screen printing, gravure printing, flexo printing, offset printing, gravure offset printing, dispenser application, nozzle coating, capillary coating, or ink-jet method. In the embodiment, those coating methods can be used singly or in combination. The photoelectric conversion layer preferably has a thickness of 10 to 1000 nm.

(Counter Electrode)

The counter electrode 16 is made of electroconductive and, if necessary, transparent materials. Examples of the materials for the counter electrode 16 include: metals, such as, platinum, gold, silver, copper, nickel, cobalt, iron, manganese, tungsten, titanium, zirconium, tin, zinc, aluminum, indium, chromium. lithium, sodium, potassium, rubidium, cesium, calcium, magnesium, barium, samarium, and terbium; alloys containing them; electroconductive metal oxides, such as, ITO and indium-zinc oxide (IZO); electroconductive polymers, such as, PEDOT:PSS; and carbon materials, such as, graphene, carbon nanotube and carbon paste.

The counter electrode 16 can be formed by a process of vacuum film-formation, such as, vacuum deposition or sputtering; by a sol-gel process; or by a wet-coating process. The method for forming the counter electrode 16 is appropriately selected according to the adopted materials.

EXAMPLES

Examples and evaluation results thereof are described below.

In the following examples, the first and second intermediate layers are a hole transport layer comprising PEDOT:PSS as a material (organic material) and an electron transport layer comprising 60PCBM as a material (organic material), respectively.

Example 1 and Comparative Examples 1 and 2

In Example 1, a PEN film was adopted as the substrate, on which an ITO layer was formed (Example 1). In that step, the PEN film was first placed on a rigid support, and then the ITO layer was formed on the film.

Specifically, a PEN film of 125 μm thickness was laminated via an adhesive layer on a glass plate serving as the rigid support. The adhesive layer employed here had a property of reducing adhesion thereof at a low temperature.

The surface of the laminated PEN film was then subjected to sputtering at 60° C. to form an amorphous-phase ITO layer of 150 nm thickness. Since the layer was formed at 60° C., the PEN film hardly suffered from thermal damage. The ITO layer was so formed that the In/Sn weight ratio might be 24 (In:Sn=96 mass %:4 mass %). The In/Sn weight ratio was calculated from measurement results of energy dispersive X-ray spectrometry (EDS, measurement system: SU8020 ([trademark], manufactured by Hitachi High-Technologies Corporation) and EDAX OCTANE SUPER ([trademark], manufactured by AMETEK, Inc.; condition: accelerating voltage=15 kV). The obtained PEN film/amorphous-phase ITO layer was annealed in air at 150° C. for 1 hour. This annealing treatment is presumed to partly convert the amorphous-phase ITO into the crystal-phase ITO. (Example 1)

Figure 2:
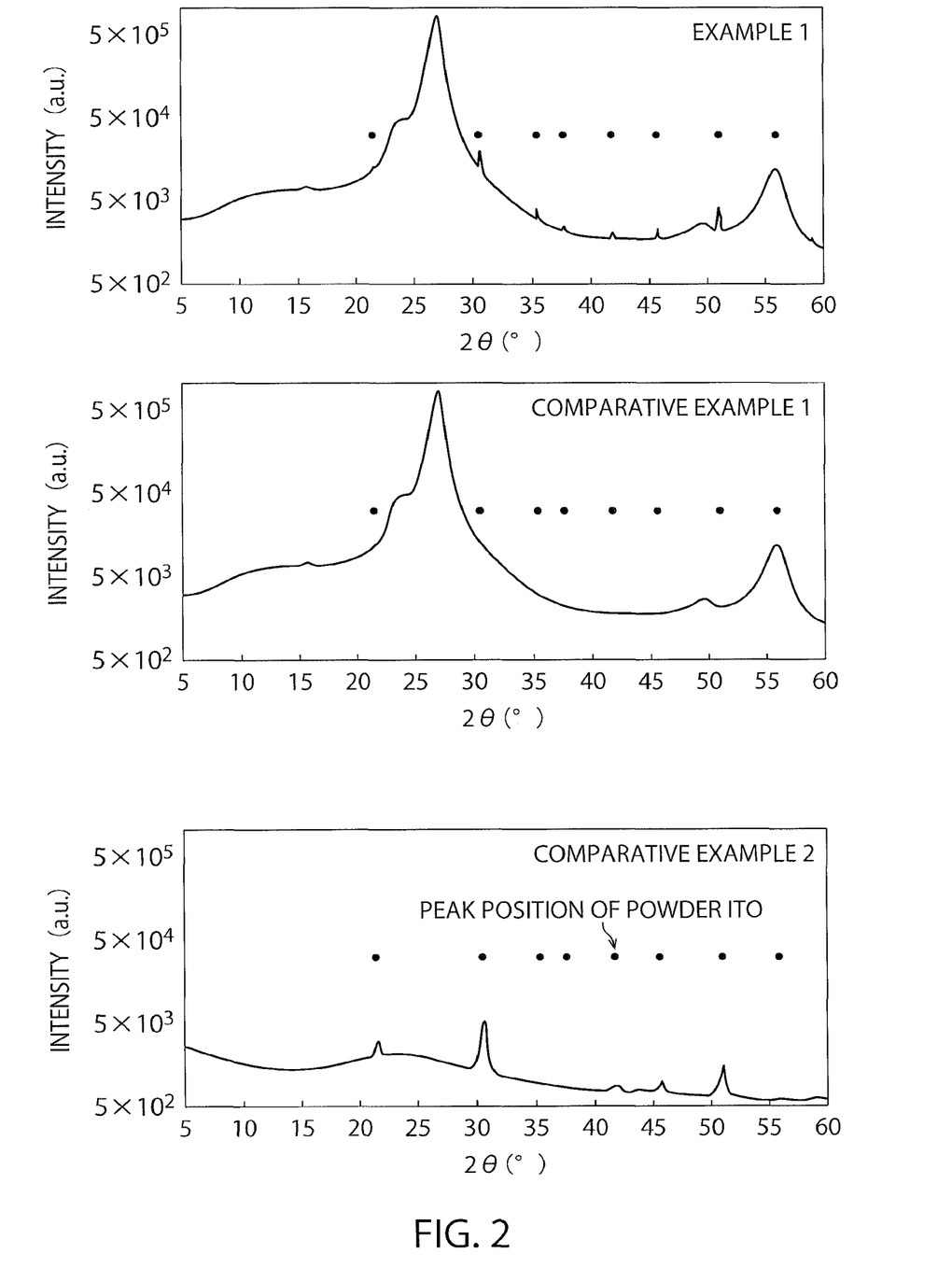
FIG. 2 shows X-ray diffraction profiles of the ITO layers in Example 1A and Comparative examples 1A and 2A.

FIG. 2 shows X-ray diffraction profiles of the substrate provided with the ITO layer in which the amorphous phase was partly converted into the crystal phase (Example 1, In:Sn=96 mass %:4 mass %; annealed in air at 150° C. for 1 hour) and of that provided with an amorphous-phase ITO layer (Comparative example 1, In:Sn=93 mass %:7 mass %; not annealed). The diffraction profiles were obtained by out-of-plane measurement with an X-ray diffraction system (SmartLab [trademark], manufactured by Rigaku Corporation) under the condition of incident Soller 5.0°. FIG. 2 also shows XRD data of a glass substrate provided with a crystal-phase ITO layer formed thereon by conventional sputtering at 300° C. (Comparative example 2). The peaks at about 2θ=26° and 56° in the profiles of Example 1 and Comparative example 1 are attributed to the PEN film. When the amorphous-phase ITO layer was annealed, the peaks assigned to the crystal phase were observed at about 2θ=21°, 31°, 35°, 42°, 46° and 51°. Accordingly, this indicates that the amorphous phase was converted into the crystal phase. The following is the comparison between the XRD peaks of Example 1 and those of Comparative example 1.

TABLE 1

|  | Ex. 1 | Com. 2 |
|---|---|---|
| peak position 2θ (°) | 21.52 | 21.362 |
| half-width Fwhm (°) | 0.14 | 0.28 |
| peak position 2θ (°) | 30.59 | 30.342 |
| half-width Fwhm (°) | 0.16 | 0.46 |
| peak position 2θ (°) | 45.65 | 45.363 |
| half-width Fwhm (°) | 0.19 | 0.34 |
| peak position 2θ (°) | 50.97 | 50.775 |
| half-width Fwhm (°) | 0.24 | 0.54 |

Subsequently, the micromorphology of the ITO layer was observed according to cross-sectional TEM. The TEM observation was carried out by means of H9500 ([trademark], manufactured by Hitachi High-Technologies Corporation) under the condition of accelerating voltage=300 kV.

From the ITO layers of Example 1 and Comparative examples 1 and 2, samples were individually picked up with a FIB gun (XVision 210TBS [trademark], manufactured by Hitachi High-Technologies Corporation). The samples were then thinned to about 0.1 μm, and subjected to cross-sectional TEM observation. When the samples were prepared, carbon and tungsten films were formed thereon as top surface-protective films.

Dark field images of TEM are effective in qualitatively evaluating whether the observation object forms a crystal or not. That is because, in the dark-field TEM observation, the objective aperture is appropriately positioned so that waves diffracted from a specific crystal face can form an image. The dark field image of Comparative example 1 was uniformly indistinct, and hence it was found that the whole ITO layer was in a homogeneous amorphous phase. On the other hand, in the dark field image of Comparative example 2, plural areas having different brightness were observed in the whole cross-section. The areas having similar brightness correspond to crystal-phase domains having the same crystal face, and hence it was found that relatively small crystal-phase domains were distributed throughout the cross-section. The crystal-phase domains in Comparative example 2 were found to have crystal face sizes of at most about 20 nm.

In contrast, the dark field image of Example 1 showed the presence of both amorphous phase and relatively large crystal-phase domains. The crystal-phase domains in Example 1 were found to have crystal face sizes of 50 nm or more.

The reason why the crystal-phase domains were large in Example 1 is presumed to be because the annealing conditions were so moderate that the ITO crystals could grow similarly.

(Evaluation of Surface Electric Resistance)

The surface electric resistance of each ITO layer was then measured. Specifically, the resistance between two points separated by 2 cm on the ITO layer was measured via an auxiliary electrode. Table 2 shows the results.

TABLE 2

| ITO substrate | Ex. 1 | Com. 1 | Com. 2 |
|---|---|---|---|
| resistance (Ω) | 15 | 20 | 9 |
| ITO thickness (nm) | 150 | 150 | 150 |

(Evaluation of Acid Resistance)

The acid resistance of each ITO layer was evaluated. Specifically, the ITO layer was immersed in 3.5% HCl for 10 minutes, and the electric resistance was compared between before and after the immersion. As a result, the sample of Comparative example 1 was found to lose the ITO layer almost completely, and hence the electric resistance thereof was so large as to be above the measuring range. In contrast, the sample of Example 1 was confirmed to keep the ITO layer although the resistance thereof increased.

(Evaluation of Flexibility)

The flexibility of the ITO layer of Example 1 was evaluated. Specifically, the sample of Example 1 was curled 10 times around a cylinder having 44 mm radius of curvature, and the electric resistance was compared between before and after the curling procedure. As a result, the resistance was not changed and hence it was found that the ITO layer of Example 1 has enough flexibility to avoid destruction by curling.

Example 1A

The ITO layer of Example 1 was employed to produce a photoelectric conversion device.

First, the ITO substrate was irradiated with ultraviolet ozone (UV-O₃) to remove organic contaminants attached on the surface thereof. Thereafter, a PEDOT:PSS solution was dropped onto the ITO substrate through a filter of 0.45 μm pore diameter and then spin-coating was carried out at 4000 rpm for 30 seconds to form a first intermediate layer (hole transport layer). As the PEDOT:PSS solution, Al4083 ([trademark], manufactured by Heraeus GmbH) was adopted. The pH value and work function of Al4083 are 1.2 to 2.2 and about 5.0 eV, respectively. Successively, the ITO substrate was heated in air at 140° C. for 10 minutes to remove excess solvent.

On the formed first intermediate layer, a photoelectric conversion layer was formed in the following manner. First, a perovskite-material dispersion was prepared by adding 178 mg of methylammonium iodide ($CH_3NH_3I$) and 515 mg of lead iodide ($PbI_2$) into 1 mL of dimethylformamide (DMF). The prepared perovskite solution was applied by spin-coating to form a photoelectric conversion layer. The spin-coating application was carried out at 5000 rpm for 45 seconds. During the spin-coating application, the coating film of the perovskite solution was blown with nitrogen gas to accelerate drying. That is because the perovskite layer can be eventually formed more homogeneously by nitrogen blowing than by natural drying. The coating film was then heated at 70° C. for 2 hours to promote crystallization in the perovskite layer and thereby to form a photoelectric conversion layer.

Subsequently, a 60PCBM layer of about 100 nm thickness serving as the second intermediate layer (electron transport layer) was formed in the following manner. In 1 mL of monochlorobenzene, 20 mg of 60PCBM was added and stirred to prepare a 60PCBM solution. The prepared solution was applied by spin-coating on the photoelectric conversion layer, and then naturally dried in a nitrogen atmosphere to form a second intermediate layer. The formed second intermediate layer was further coated with an about 10-nm thick BCP (2,9-dimethyl-4,7-diphenyl-1,10-phenanthrone (bathocuproine)) layer serving as the third intermediate layer, and then furthermore coated with an about 100-nm thick Ag layer serving as the counter electrode. The Ag layer was formed by vacuum deposition.

The conversion efficiency of the thus produced photoelectric conversion device was measured and found to be 6.0%. The measurement was carried out by means of a solar simulator at an irradiance of 100 W/cm$^2$ on the basis of the reference spectrum of air mass (AM) 1.5G.

Comparative Example 1A

The procedure of Example 1A was repeated except for employing the ITO substrate of Comparative example 1, to produce a photoelectric conversion device. The conversion efficiency of the thus produced device was measured and found to be 5.0%.

Comparative Example 2A

The procedure of Example 1A was repeated except for employing the ITO substrate of Comparative example 2, to produce a photoelectric conversion device. The conversion efficiency of the thus produced device was measured and found to be 7.2%.

Table 3 shows the electrical properties of Example 1A and Comparative examples 1A and 2A.

TABLE 3

|  | Ex. 1A | Com. 1A | Com. 2A |
| --- | --- | --- | --- |
| substrate | Ex. 1 | Com. 1 | Com. 2 |
| short-circuit current density Jsc (mA/cm$^2$) | 10.7 | 11.4 | 12.4 |
| open circuit voltage Voc (V) | 0.90 | 0.91 | 0.84 |
| fill factor FF | 0.63 | 0.48 | 0.69 |
| photoelectric conversion efficiency PCE (%) | 6.0 | 5.0 | 7.2 |

The fill factor in Comparative example 1A was found to be remarkably impaired. That is presumed to be because the amorphous-phase ITO layer was damaged by acidic ingredients of PEDOT:PSS. In contrast, the fill factor in Example 1A was found to be comparable with that in Comparative example 2A, in which the device comprised an acid-resistant ITO layer. Accordingly, the device of Example 1A was verified to have acid-resistance.

Example 2A

The procedure of Example 1A was repeated except for employing a PEDOT:PSS solution having a PH value of 2.9 and a work function of about 5.9 eV, to produce a photoelectric conversion device. Since having a low proton concentration and a deep work function, the PEDOT:PSS solution can be expected to realize a high open circuit voltage and a high efficiency. The conversion efficiency of the produced device was measured and found to be 11.2%.

Comparative Example 3A

The procedure of Example 2A was repeated except for employing a glass substrate provided with a crystal-phase ITO layer formed thereon, to produce a solar cell. The conversion efficiency of the thus produced perovskite solar cell was measured and found to be 11.4%.

Table 4 shows the electrical properties of Example 2A and Comparative example 3A.

TABLE 4

|  | Ex. 2A | Com. 3A |
| --- | --- | --- |
| short-circuit current density Jsc (mA/cm$^2$) | 16.9 | 17.2 |
| open circuit voltage Voc (V) | 0.93 | 0.9 |
| fill factor FF | 0.71 | 0.73 |
| photoelectric conversion efficiency PCE (%) | 11.2 | 11.4 |

(Evaluation of Heat-Resistance)

Figure 3:
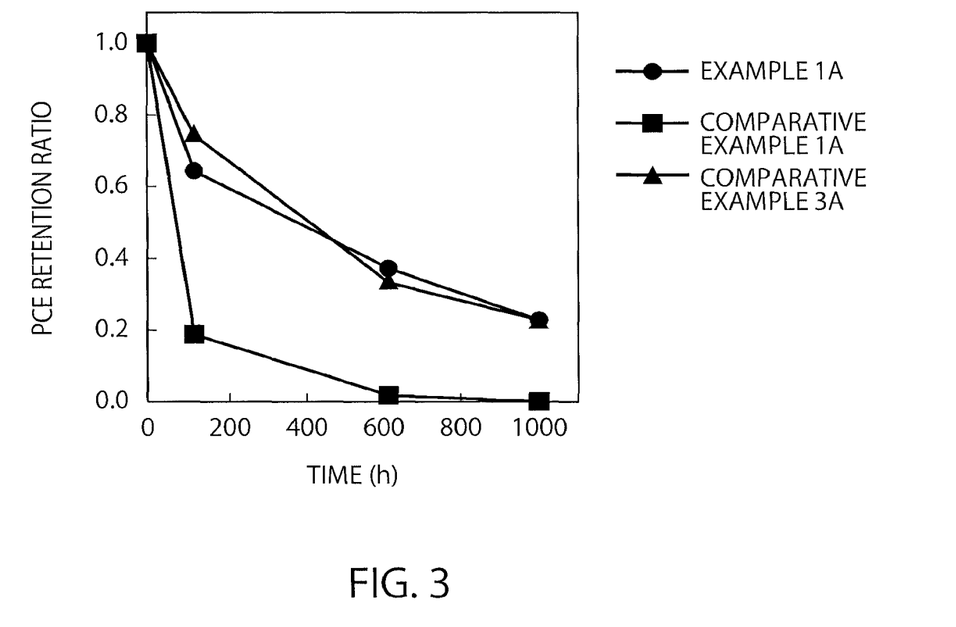
FIG. 3 shows the results of heat tests in Example 1A and Comparative examples 1A and 2A.

Heat tests according to JIS-C8938 was carried out at 85° C. in an inert (nitrogen) atmosphere, to evaluate heat-resistance of the samples of Example 1A and Comparative examples 1A and 2A. FIG. 3 shows the results within an elapsed time of 1009 hours. The device of Example 1 exhibited heat-resistance comparable with that of Comparative example 2A and superior to that of Comparative example 1A.

While subjected to the above heat tests, the devices were fixed on supports. Independently, the devices were separated from the supports and subjected to the same heat tests. As a result, the device of Example 1 also exhibited heat-resistance comparable with that of Comparative example 2A and superior to that of Comparative example 1A. Accordingly, the device of Example 1 was found to have heat-resistance not affected by whether the support was removed or not.

Example 4A

Another device was produced. The produce device comprised the first and second intermediate layers serving as electron and hole transport layers, respectively.

First, an amorphous-phase ITO layer was formed on a PEN film in the same manner as that in Example 1, and then subjected to the annealing treatment. Subsequently, the surface thereof was irradiated with ultraviolet ozone (UV-$O_3$) to remove organic contaminants attached on the ITO substrate. Independently, 0.47 mL of tetraisopropyl orthotitanate as the material of the electron transport layer was dissolved in a mixed solvent of 0.12 mL of nitric acid, 2.5 mL of ethanol and 0.11 mL of water, to prepare a solution. The solution was dropped onto the ITO layer, and applied by spin-coating at 3000 rpm for 30 seconds.

The spin-coated sample was heated on a hot plate at 140° C. to promote a hydrolysis reaction for forming a $TiO_2$ film. The formed $TiO_2$ film was coated with a photoelectric conversion layer containing perovskite materials in the same manner as that in Example 1A. Thereafter, the photoelectric conversion layer was spin-coated at 3000 rpm for 30 seconds with a chlorobenzene solution of poly3-hexylthiophene (P3HT) in a concentration of 20 mg/mL. The wet coating film was dried to form a hole transport layer, on which an Ag electrode layer was further formed in the same manner as that in Example 1A.

The conversion efficiency of the produced device was measured and found to be 13.0%.

Comparative Example 4A

The procedure of Example 4A was repeated except that the annealing treatment was not carried out after the amorphous-phase ITO layer was formed, to produce a solar cell. The conversion efficiency of the thus produced device was measured and found to be 9.0%.

Example 5A

First, an amorphous-phase ITO layer was formed on a PEN film in the same manner as that in Example 1, and then subjected to the annealing treatment. Subsequently, the surface thereof was irradiated with ultraviolet ozone (UV-$O_3$) to remove organic contaminants attached on the ITO substrate. Independently, $SnO_2$ nanoparticles having a mean size of 20 to 40 nm were dispersed in butanol to prepare a dispersion as the material of the electron transport layer. The dispersion was dropped onto the ITO layer, and applied by spin-coating at 3000 rpm for 30 seconds.

The spin-coated sample was heated on a hot plate at 150° C. for 5 minutes to form a $SnO_2$ film. The formed $SnO_2$ film was coated with a photoelectric conversion layer containing perovskite materials in the same manner as that in Example 1A. Thereafter, the photoelectric conversion layer was spin-coated at 4000 rpm for 30 seconds with a solution in which 80 mg of 2,2',7,7'-tetrakis(N,N-di-p-methoxyphenylamino)-9.9'-spirobifluorene was dissolved in a mixed solvent of 1 mL of chlorobenzene, 0.05 mL of Li-TFSi and 0.01 mL of 4-tert-butylpyridine. The wet coating film was dried to form a hole transport layer, on which an Ag electrode layer was further formed in the same manner as that in Example 1A.

The conversion efficiency of the produced device was measured and found to be 12.0%.

Comparative Example 5A

The procedure of Example 5A was repeated except that the annealing treatment was not carried out after the amorphous-phase ITO layer was formed, to produce a solar cell. The conversion efficiency of the thus produced device was measured and found to be 10.5%.

As describe above, the present embodiments and examples thereof make it possible to produce an acid-resistant flexible photoelectric conversion device, which comprises a polymer film substrate provided with a crystal-phase ITO layer, without fear that the polymer film substrate may be thermally damaged, and consequently can improve the conversion efficiency. In addition, since the crystal-phase ITO layer can be formed by annealing an amorphous-phase ITO layer in air, the device can be manufactured by such a simple production process as to reduce the production cost. Thus, the present embodiments can provide a flexible, light-weight, highly efficient and low-cost photoelectric conversion device.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fail within the scope and sprit of the invention.

The invention claimed is:

1. A photoelectric conversion device, comprising a laminate structure of:
   a flexible substrate made of an organic material having a heat-resistant temperature of 240° C. or below;
   an indium-tin oxide electrode comprising the indium and tin in an In/Sn weight ratio of 24 or more;
   a photoelectric conversion layer; and
   a counter electrode,
   wherein:
   the indium-tin oxide electrode comprises crystal-phase domains and has an average thickness of 150 nm or less;
   the crystal-phase domains are distributed throughout the indium-tin oxide electrode; and
   the indium-tin oxide electrode shows an X-ray diffraction profile in which the peak at a diffraction peak position in the range of $2\theta=30.6\pm0.5°$ has a half-width of $1.0°$ or less when subjected to surface X-ray diffraction analysis according to Bragg-Brebdano method using CuKα line.

2. The device according to claim 1, wherein the peak at a diffraction peak position in the range of $2\theta=51.0\pm0.5°$ has a half-width of $1.0°$ or less in the X-ray diffraction profile.

3. The device according to claim 1, wherein the photoelectric conversion layer comprises a perovskite compound.

4. The device according to claim 1, wherein the photoelectric conversion layer has a heterojunction or bulk heterojunction structure comprising an organic substance.

5. The device according to claim 1, wherein the organic material has a heat-resistant temperature in a range of from 100 to 160° C.

6. The device according to claim 1, wherein the organic material is selected from the group consisting of a polyethylene naphthalate, a polyethylene terephthalate, a polyethylene, a polyimide, a polyamide, a polyamide-imide, and a liquid crystal polymer.

7. The device according to claim 1, wherein the organic material comprises polyethylene naphthalate.

8. The device according to claim 1, wherein the crystal-phase domains in the indium-tin oxide electrode comprise a crystal face size of 50 nm or more.

9. The device according to claim 1, wherein the indium-tin oxide electrode has a higher acid resistance relative to an indium-tin oxide electrode having an In/Sn ratio of 23 or less, based upon 10 minutes of immersion in 3.5% HCl.

10. The device according to claim 1, which is suitable to be curled 10 times around a cylinder having a 44 mm radius of curvature and avoid destruction.

11. A method for manufacturing a photoelectric conversion device comprising a laminate structure of:
   a flexible substrate made of an organic material having a heat-resistant temperature of 240° C. or below;
   an indium-tin oxide electrode comprising the indium and tin in an In/Sn weight ratio of 24 or more;
   a photoelectric conversion layer; and
   a counter electrode,
the method comprising:
   forming an indium-tin oxide film on the flexible substrate; and then
   subjecting the indium-tin oxide film to annealing treatment at a temperature of 200° C. or less, to obtain the laminate structure, wherein:
   the indium-tin oxide electrode comprises crystal-phase domains and has an average thickness of 150 nm or less;
   the crystal-phase domains are distributed throughout the indium-tin oxide electrode; and
   the indium-tin oxide electrode shows an X-ray diffraction profile in which the peak at a diffraction peak position in the range of $2\theta=30.6\pm0.5°$ has a half-width of 1.0° or less when subjected to surface X-ray diffraction analysis according to Bragg-Brebdano method using CuKα line.

12. The method according to claim 11, wherein the annealing treatment is carried out for 0.5 to 6 hours.

13. The method according to claim 11, wherein the indium-tin oxide film is formed by a process of vacuum film-formation selected from the group consisting of vacuum deposition and sputtering.

14. The method according to claim 11, wherein the crystal-phase domains in the indium-tin oxide electrode of the laminate structure comprise a crystal face size of 50 nm or more.

15. A photoelectric conversion device, comprising a laminate structure of:
   a flexible substrate made of an organic material having a heat-resistant temperature of 240° C. or below;
   an indium-tin oxide electrode comprising the indium and tin in an In/Sn weight ratio of 24 or more;
   a photoelectric conversion layer; and
   a counter electrode,
   wherein:
   the indium-tin oxide electrode consists of indium, tin, and optionally at least one other metal and has an average thickness of 150 nm or less; and
   the indium-tin oxide electrode shows an X-ray diffraction profile in which the peak at a diffraction peak position in the range of $2\theta=30.6\pm0.5°$ has a half-width of 1.0° or less when subjected to surface X-ray diffraction analysis according to Bragg-Brebdano method using CuKα line.

16. The device according to claim 15, wherein the peak at a diffraction peak position in the range of $2\theta=51.0\pm0.5°$ has a half-width of 1.0° or less in the X-ray diffraction profile.

17. The device according to claim 15, wherein the photoelectric conversion layer comprises a perovskite compound.

18. The device according to claim 15, wherein the photoelectric conversion layer has a heterojunction or bulk heterojunction structure comprising an organic substance.

19. The device according to claim 15, wherein the organic material has a heat-resistant temperature in a range of from 100 to 160° C.

20. The device according to claim 1, wherein the organic material is selected from the group consisting of a polyethylene naphthalate, a polyethylene terephthalate, a polyethylene, a polyimide, a polyamide, a polyamide-imide, and a liquid crystal polymer.

* * * * *